US010515160B1

(12) United States Patent
Jarvis

(10) Patent No.: US 10,515,160 B1
(45) Date of Patent: Dec. 24, 2019

(54) SYSTEMS AND METHODS FOR EXECUTING A SIMULATION OF A PHYSICAL SYSTEM VIA A GRAPHICAL USER INTERFACE

(71) Applicant: Ansys, Inc., Canonsburg, PA (US)

(72) Inventor: Glyn Jarvis, Surrey (GB)

(73) Assignee: Ansys, Inc., Canonsburg, PA (US)

( * ) Notice: Subject to any disclaimer, the term of this patent is extended or adjusted under 35 U.S.C. 154(b) by 761 days.

(21) Appl. No.: 14/827,672

(22) Filed: Aug. 17, 2015

Related U.S. Application Data

(60) Provisional application No. 62/040,549, filed on Aug. 22, 2014.

(51) Int. Cl.
| | | |
|---|---|---|
| *G06F 9/44* | (2018.01) | |
| *G06F 13/10* | (2006.01) | |
| *G06F 13/12* | (2006.01) | |
| *G06F 17/50* | (2006.01) | |
| *G06F 3/0482* | (2013.01) | |
| *G06F 3/0484* | (2013.01) | |
| *G06F 3/0488* | (2013.01) | |

(52) U.S. Cl.
CPC ........ *G06F 17/5009* (2013.01); *G06F 3/0482* (2013.01); *G06F 3/0488* (2013.01); *G06F 3/04847* (2013.01)

(58) Field of Classification Search
CPC .. G06F 17/5009; G06F 3/0488; G06F 3/0482; G06F 3/04847
USPC ...................................................... 703/20, 13
See application file for complete search history.

(56) References Cited

U.S. PATENT DOCUMENTS

| | | | | |
|---|---|---|---|---|
| 6,721,922 B1* | 4/2004 | Walters | ............... | G06F 17/5022 716/102 |
| 8,417,490 B1* | 4/2013 | Preston | ............... | G06F 17/5095 701/114 |
| 8,645,894 B1* | 2/2014 | Kukal | ................ | G06F 17/5081 716/100 |
| 2004/0249664 A1* | 12/2004 | Broverman | ....... | G06F 17/30011 705/2 |
| 2009/0107230 A1* | 4/2009 | Okcay | .................. | G01M 10/00 73/148 |

(Continued)

OTHER PUBLICATIONS

Zeng, Yuguang et al. "Multiple User Context Menus for Large Displays", Mar. 28-29, 2014, ACM SE'14, ACM. (Year: 2014).*

*Primary Examiner* — Cedric Johnson
(74) *Attorney, Agent, or Firm* — Jones Day

(57) ABSTRACT

Systems and methods are provided for executing a simulation of a physical system that includes a plurality of objects representing physical entities or phenomena. Parameters of objects currently present in a simulation are evaluated. When one of the parameters is in an invalid state, a first multi-layer context menu is provided having multiple selectable options on each layer on a graphical user interface, where a first layer includes a highlight indicating that an object needs fixed, and where a subsequent layer includes a highlight indicating an identity of the object that needs fixed. The objects currently present in the simulation are evaluated based on a task to be performed. When a required object for the task to be performed is missing from the simulation, a second multi-layer context menu having multiple selectable options on each layer is provided.

23 Claims, 21 Drawing Sheets

(56) References Cited

U.S. PATENT DOCUMENTS

| | | | | |
|---|---|---|---|---|
| 2010/0306825 A1* | 12/2010 | Spivack | ............... | H04W 4/029 726/4 |
| 2014/0047407 A1* | 2/2014 | Danielsson | ............... | G06F 8/00 717/104 |

* cited by examiner

SYSTEMS AND METHODS FOR EXECUTING A SIMULATION OF A PHYSICAL SYSTEM VIA A GRAPHICAL USER INTERFACE

CROSS-REFERENCE TO RELATED APPLICATIONS

This application claims priority to U.S. Provisional Application No. 62/040,549, filed on Aug. 22, 2014, entitled "Systems and Methods for Executing a Simulation of a Physical System Via a Graphical User Interface," the entirety of which is herein incorporated by reference.

FIELD

This disclosure is related generally to simulation of a physical system and more particularly to a graphical user interface for defining a simulation of a physical system.

BACKGROUND

A computer-implemented simulation seeks to imitate the operation of a real-world process or system over time based on a model. A simulation can analyze the behavior of multiple physical entities and phenomena within a simulation as they interact with one another and the environment. Simulations are often highly complex, including large numbers of objects that represent physical entities and phenomena within the simulation. The complexity of a simulation is often a barrier to proper set up and management of the simulation, resulting in large amounts of time-consuming troubleshooting that inhibits efficient simulation analysis.

SUMMARY

Systems and methods are provided for executing a simulation of a physical system that includes a plurality of objects representing physical entities or phenomena. Parameters of objects currently present in a simulation are evaluated. When one of the parameters is in an invalid state, a first multi-layer context menu is provided having multiple selectable options on each layer on a graphical user interface, where a first layer includes a highlight indicating that an object needs fixed, and where a subsequent layer includes a highlight indicating an identity of the object that needs fixed. The objects currently present in the simulation are evaluated based on a task to be performed. When a required object for the task to be performed is missing from the simulation, a second multi-layer context menu having multiple selectable options on each layer is provided, where a first layer includes a highlight indicating that an object needs to be added, and wherein a subsequent layer includes a highlight indicating a type of the object that needs to be added. When all required objects are present in the simulation and have valid parameters, a third context menu is provided that includes a highlight that indicates the task to be performed.

As another example, a method of executing a simulation of a physical system that includes a plurality of objects representing physical entities or phenomena includes accessing a set of conditions associated with a selected object in a simulation, where the set of conditions include a physics condition, where the physics condition includes an identification of one or more physics-types associated with the object. A pool of conditions associatable with the selected object is accessed. The pool of associatable conditions is filtered based on the one or more physics-types associated with the selected object to form a set of physics-type appropriate conditions. A menu of conditions for adding or editing for the selected object is provided, where the menu includes the physics-type appropriate conditions without displaying conditions from the pool of conditions that are not in the set of physics-type appropriate conditions.

As a further example, a method of providing a simulation definition graphical user system associated with a physical system that includes a plurality of objects representing physical entities or phenomena includes displaying a representation of a physical entity in the graphical user interface. Data associated with a definition of an object associated with a physical phenomenon is received, where the data includes a metadata physical parameter associated with the physical phenomenon. A first indicator of the physical phenomenon is displayed in the graphical user interface, where user interaction with the first indicator provides a menu associated with the physical phenomenon, and a second indicator of the physical phenomenon is displayed, where the second indicator indicates a value associated with the metadata physical parameter.

DETAILED DESCRIPTION

Figure 1:
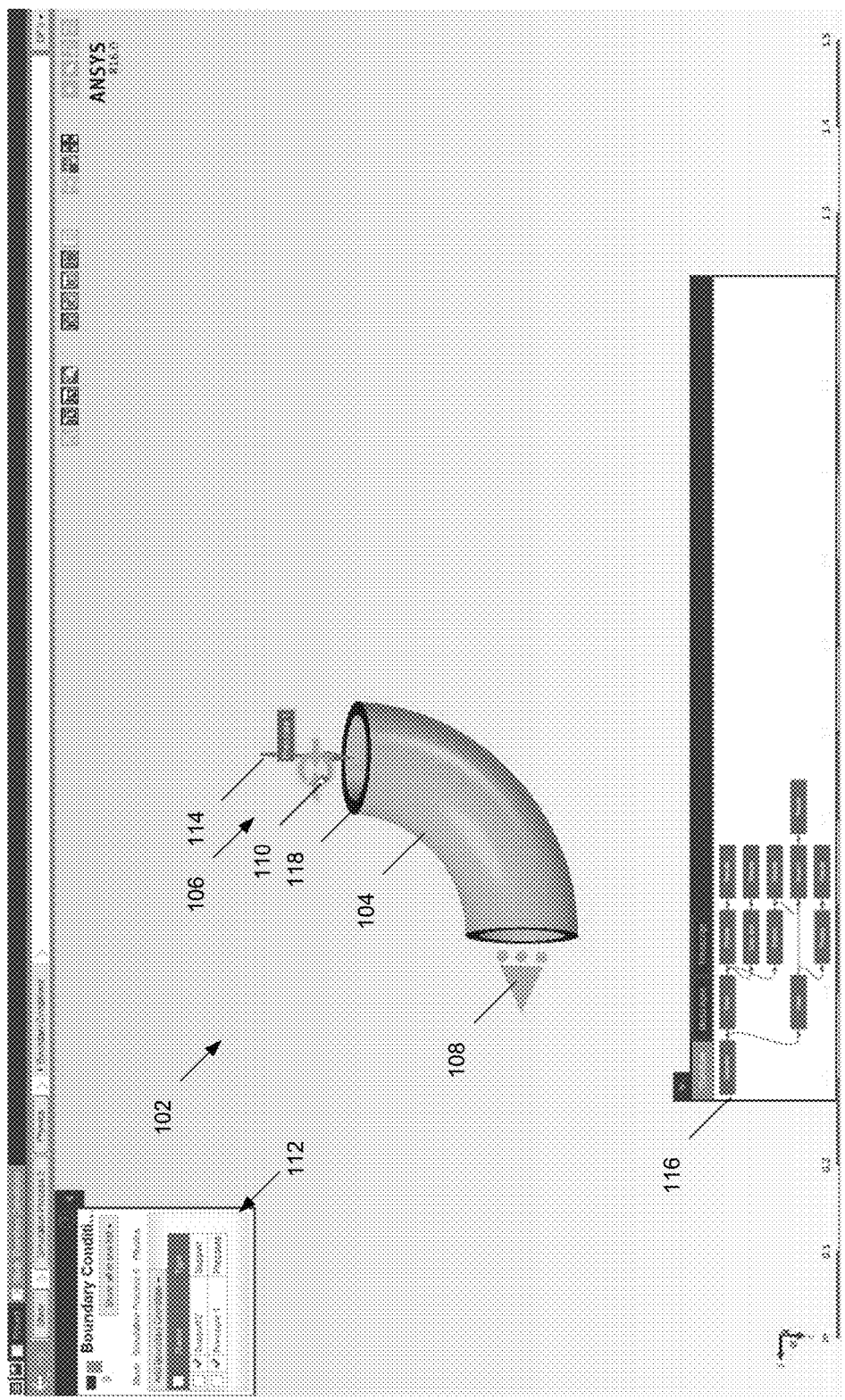
FIG. 1 is a diagram depicting a graphical user interface for defining a simulation of a physical system for execution.

FIG. 1 is a diagram depicting a graphical user interface for defining a simulation of a physical system for execution. A simulation utilizes one or more objects and their associated parameters to perform one or more tasks. Certain tasks require certain objects or types of objects to be present in the simulation (e.g., to provide necessary inputs to a task). Additionally, certain objects require the presence of certain other objects or types of objects to be present in the simulation. For example, an object representing a portion of pipe (e.g., as depicted in FIG. 1) may require an object defining a material type of the pipe to be present in the simulation in one embodiment of the disclosure. Some objects present in a simulation, in one embodiment, may be required to meet certain minimum standards for execution of tasks. For example, one type of object may require non-null or non-zero parameter values to be considered not to be in an error or invalid state.

The example of FIG. 1 is configured to simulate deformation of a pipe, when a pressure is applied to a surface of a top opening of the pipe. The graphical user interface includes a simulation visualization portion 102 that includes a plurality of objects present in the simulation. The objects are associated with physical entities or phenomena of the simulation. In the example of FIG. 1, the simulation visualization includes a visualization of a pipe object at 104, a visualization of a pressure object at 106, and a visualization of a support object at 108. The visualization of the pipe object at 104 indicates a size and shape of a pipe represented in the simulation. The visualization of the pressure object at 104 includes a first indicator 110 depicting a symbol representative of a pressure object. By interacting with the first indicator 110 a pop-up menu (not shown) or a grid view of objects 112 and a follow on parameter definition menu (not shown) parameters of the pressure object can be defined. A second indicator 114, in the form of an arrow in FIG. 1, indicates a value of a metadata physical parameter of the pressure object, where the arrow 114 indicates a direction of the pressure and a point of application of the pressure (i.e., on the top surface 118 of the pipe object 104). The visualization of the support object at 108 indicates that the pipe object 104 is being supported by another structure attached in the indicated direction.

The graphical user interface 102 further includes a workflow display 116 that provides a flow diagram that indicates objects and tasks associated with the simulation. The flow diagram includes representations of one or more tasks to be performed in the simulation and input and output dependencies of those tasks. In one example, the icons of the workflow display 116 can include attention indicators that alert a user when a task is in an error condition or when a task needs to be rerun (updated) because an upstream entity on which that task relies has been changed.

Figure 2:
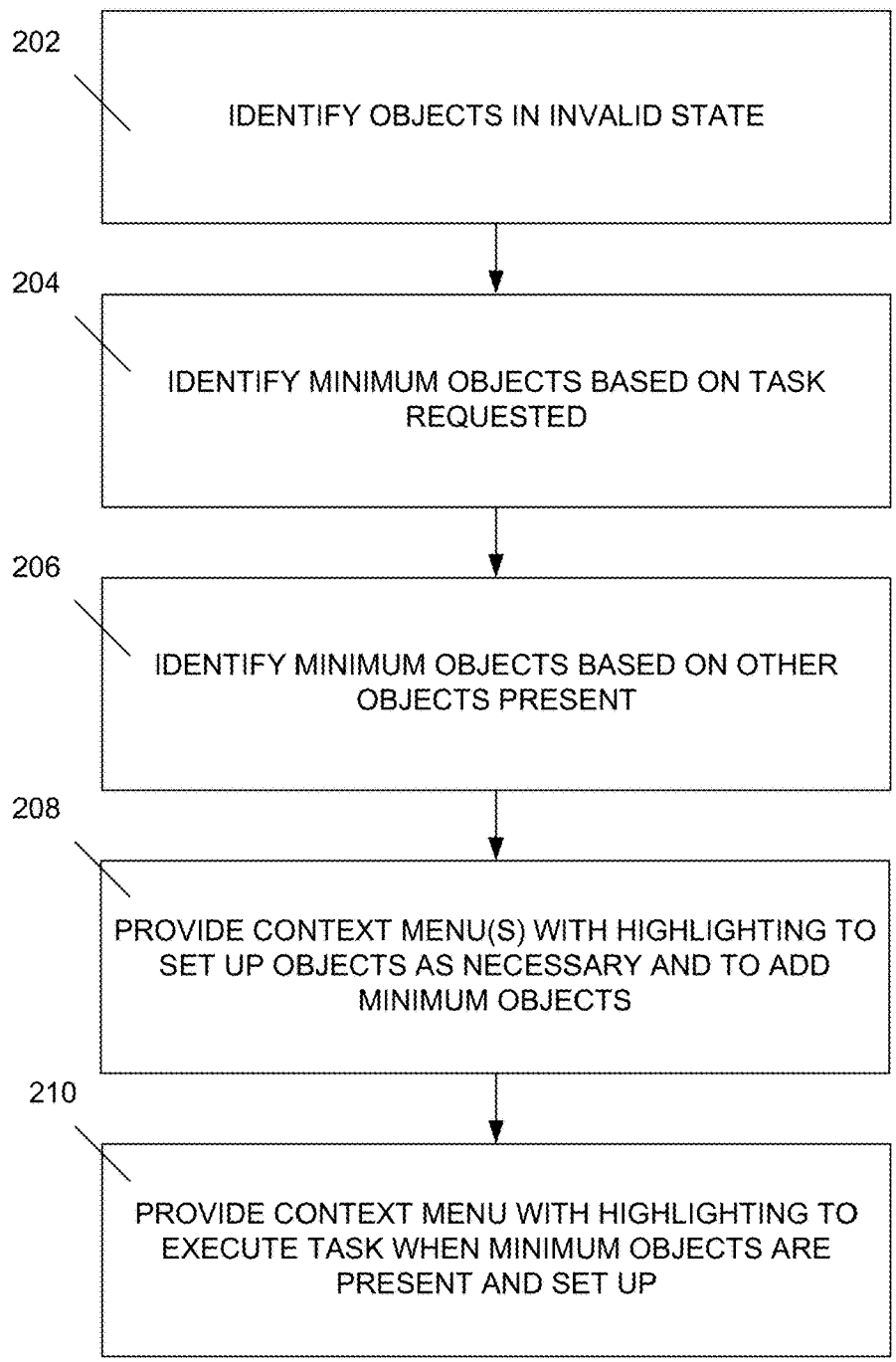
FIG. 2 is a flow diagram depicting a method of directing set up of a simulation that includes a plurality of objects representing physical entities or phenomena.

FIG. 2 is a flow diagram depicting a method of directing set up of a simulation that includes a plurality of objects representing physical entities or phenomena. At 202 parameters of objects currently present in a simulation are evaluated to determine if any of the parameters are in an invalid state. If any of the parameters are in an invalid state, that object is identified as needing fixed. At 204, objects currently present in the simulation are evaluated based on a task to be performed during the simulation. If fewer than a minimum set of required objects for the task are currently present in the simulation, then it is noted that objects need to be added to the simulation. Similarly, at 206, objects currently present in the simulation are evaluated to determine if any other objects are missing from the simulation based on requirements of objects currently present in the simulation. If fewer than the minimum set of required objects for the objects currently present in the simulation are currently present in the simulation, then it is noted that objects need to be added to the simulation.

At 208, one or more context menus are provided with highlighting to set up objects as necessary to fix invalid states and to add minimum objects to meet minimum requirements for executing the desired tasks. For example, when one of the parameters of an object is in an invalid state, a first multi-layer context menu having multiple selectable options on each layer on a graphical user interface is provided, where a first layer includes a highlight indicating that an object needs fixed, and where a subsequent layer includes a highlight indicating an identity of the object that needs fixed. When a required object for the task to be performed is missing from the simulation, a second multi-layer context menu having multiple selectable options on each layer is provided, where a first layer includes a highlight indicating that an object needs to be added, and where a subsequent layer includes a highlight indicating a type of the object that needs to be added. When a required object is missing from the simulation that is needed by an already present object in the simulation, another multi-layer context menu having multiple selectable options on each layer is provided, where a first layer includes a highlight indicating that an object needs to be added, and where a subsequent layer includes a highlight indicating a type of the object that needs to be added. At 210, when all tasks are in a valid state and all required objects are present in the simulation, a context menu is provided with an indicator that highlights that a task is ready to be executed.

Figure 3:
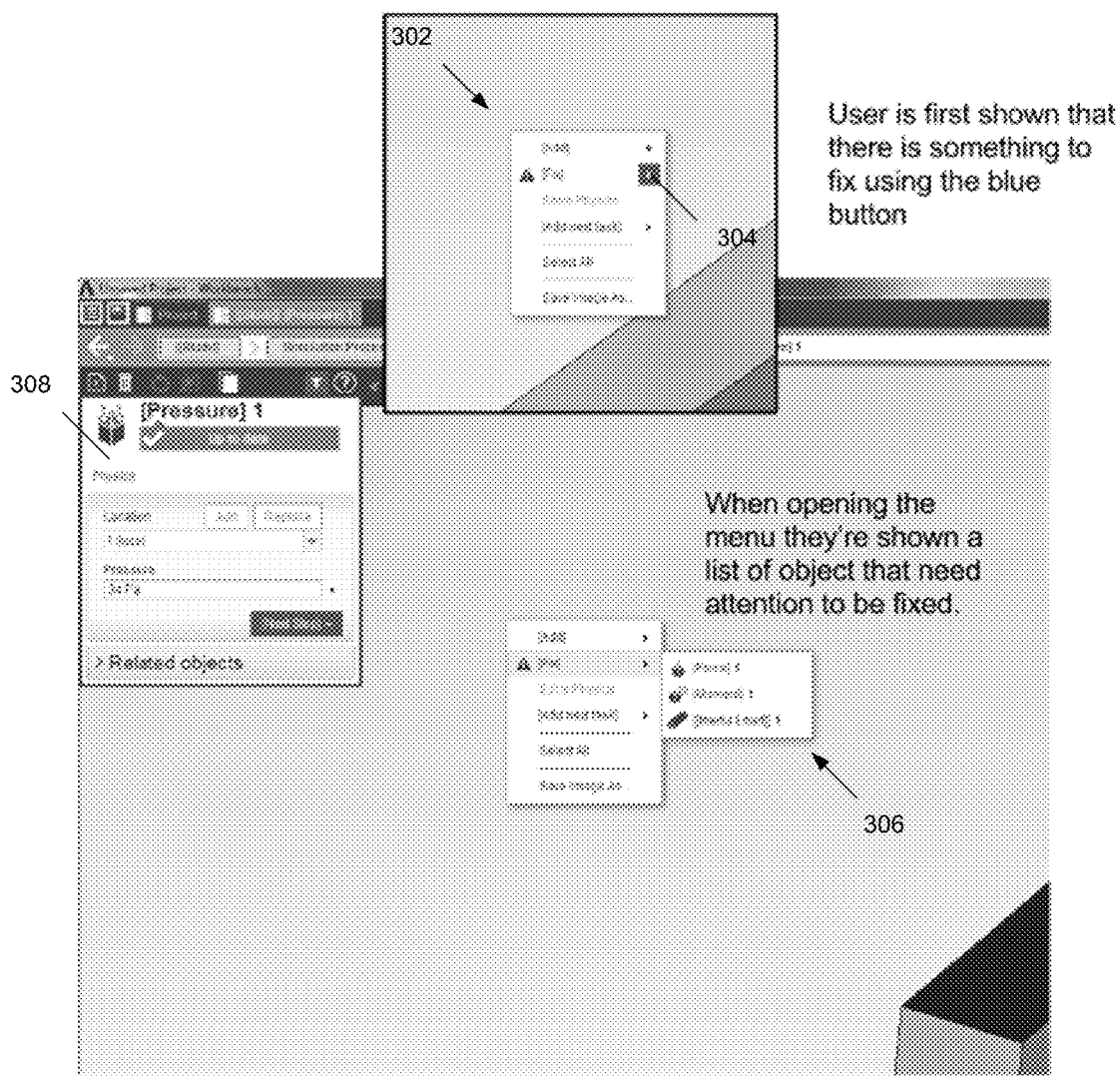
FIG. 3 is a diagram depicting a graphical user interface that includes a first multi-layer context menu displayed when a parameter of an object is in an invalid state.

FIG. 3 is a diagram depicting a graphical user interface that includes a first multi-layer context menu displayed when a parameter of an object is in an invalid state. The simulation definition engine has evaluated objects currently in the simulation and has determined that three of those objects have parameters in an invalid state. A context menu is accessed, such as via a right click operation in a simulation visualization portion of the graphical user interface. A first layer of the context menu is presented at 302. The first layer of the context menu at 302 includes a highlight at 304 indicating that an object needs to be fixed. When a user navigates to the indicated row for fixing objects at 304, a subsequent layer of the context menu includes an indication of identities of the objects that need fixed at 306. Upon selection of one of the objects listed at 306, parameters of those objects can be edited via a parameter definition menu 308, a popup menu, or other prompt.

Figure 4:
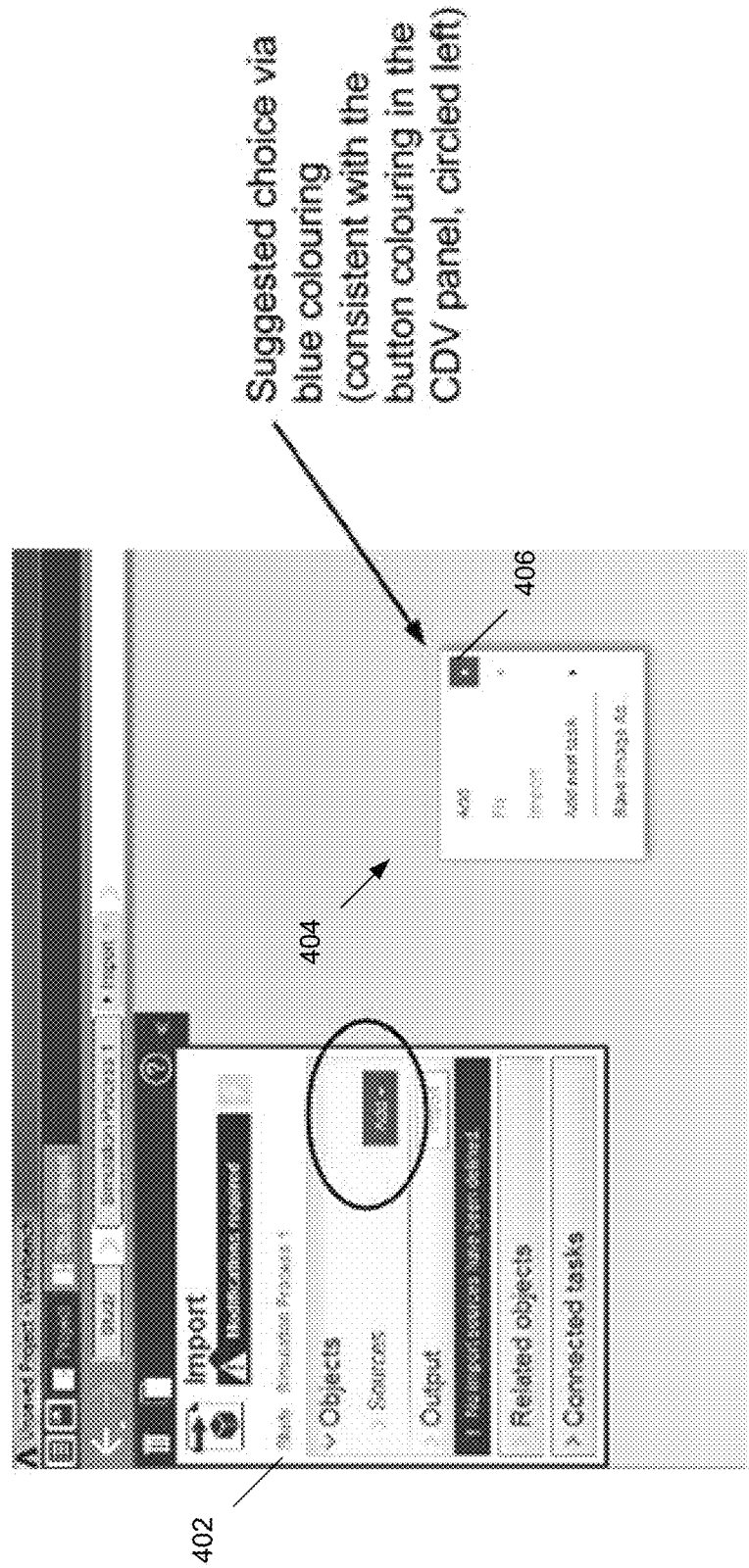
FIG. 4 is a diagram depicting a graphical user interface that includes a second multi-layer context menu displayed when a required object for a task to be performed is missing from the simulation.
Figure 5:
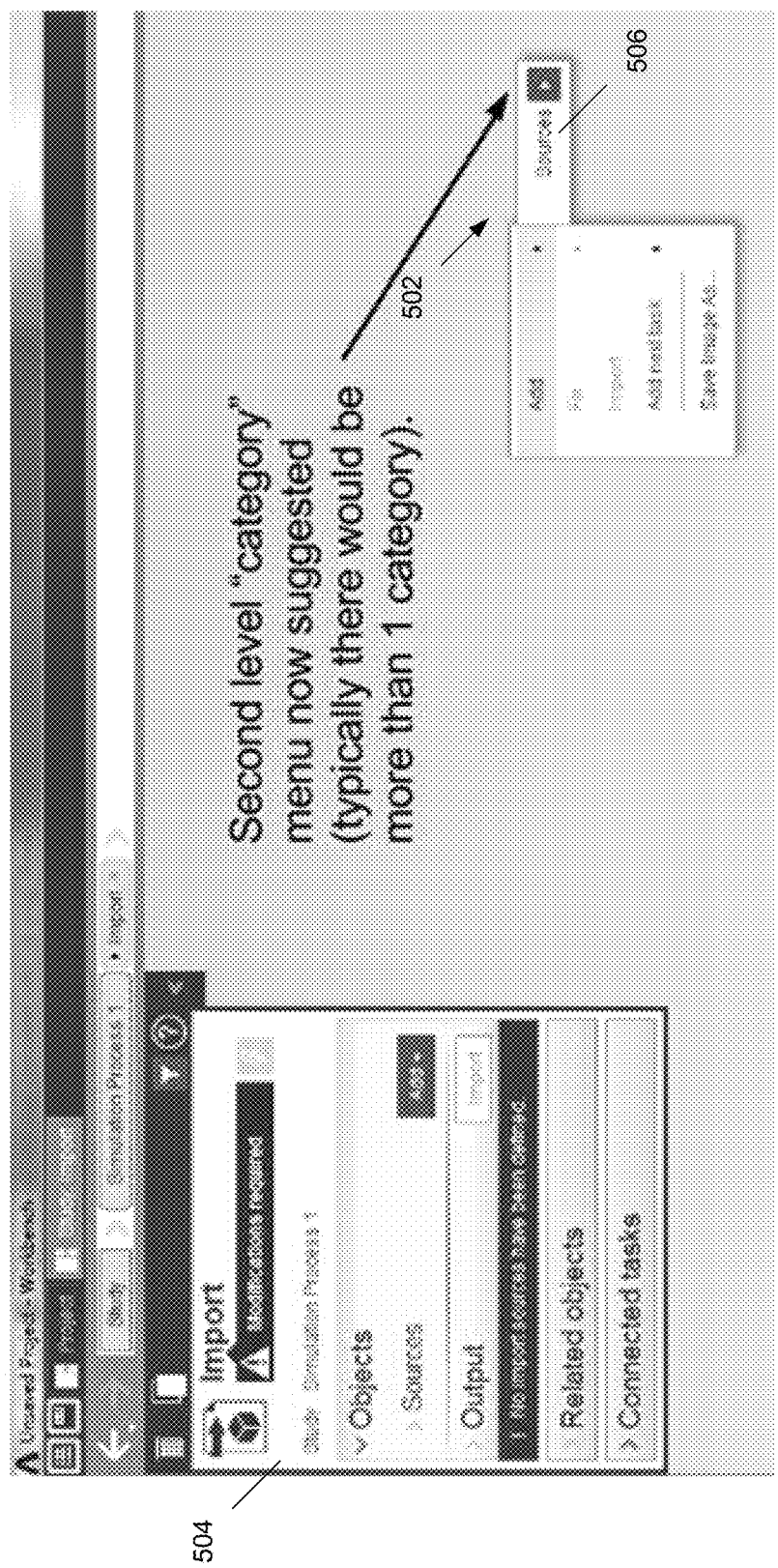
FIG. 5 is a diagram depicting a subsequent layer of the context menu of FIG. 4.

FIG. 4 is a diagram depicting a graphical user interface that includes a second multi-layer context menu displayed when a required object for a task to be performed is missing from the simulation. In the example of FIG. 4, the simulation includes an import task, as indicated in the parameter definition menu 402. An import task requires a source object for the import task to be present in the simulation, where such a source object is missing in the example of FIG. 4. Thus, upon a right click operation by a user, a second multi-layer context menu is presented. A first layer is depicted at 404. That first layer includes a highlight at 406 indicating that an object needs to be added to the simulation. FIG. 5 is a diagram depicting a subsequent layer of the context menu of FIG. 4. The subsequent layer of the context menu at 502 indicates a type of object that needs to be added to the simulation. In the example of FIG. 5, the import task, depicted as being present in the simulation at 504 requires a source object to be added, as noted at 506. Subsequent layers of the context menu may depict source object sub-types that may be selected from for adding to the simulation.

Figure 6:
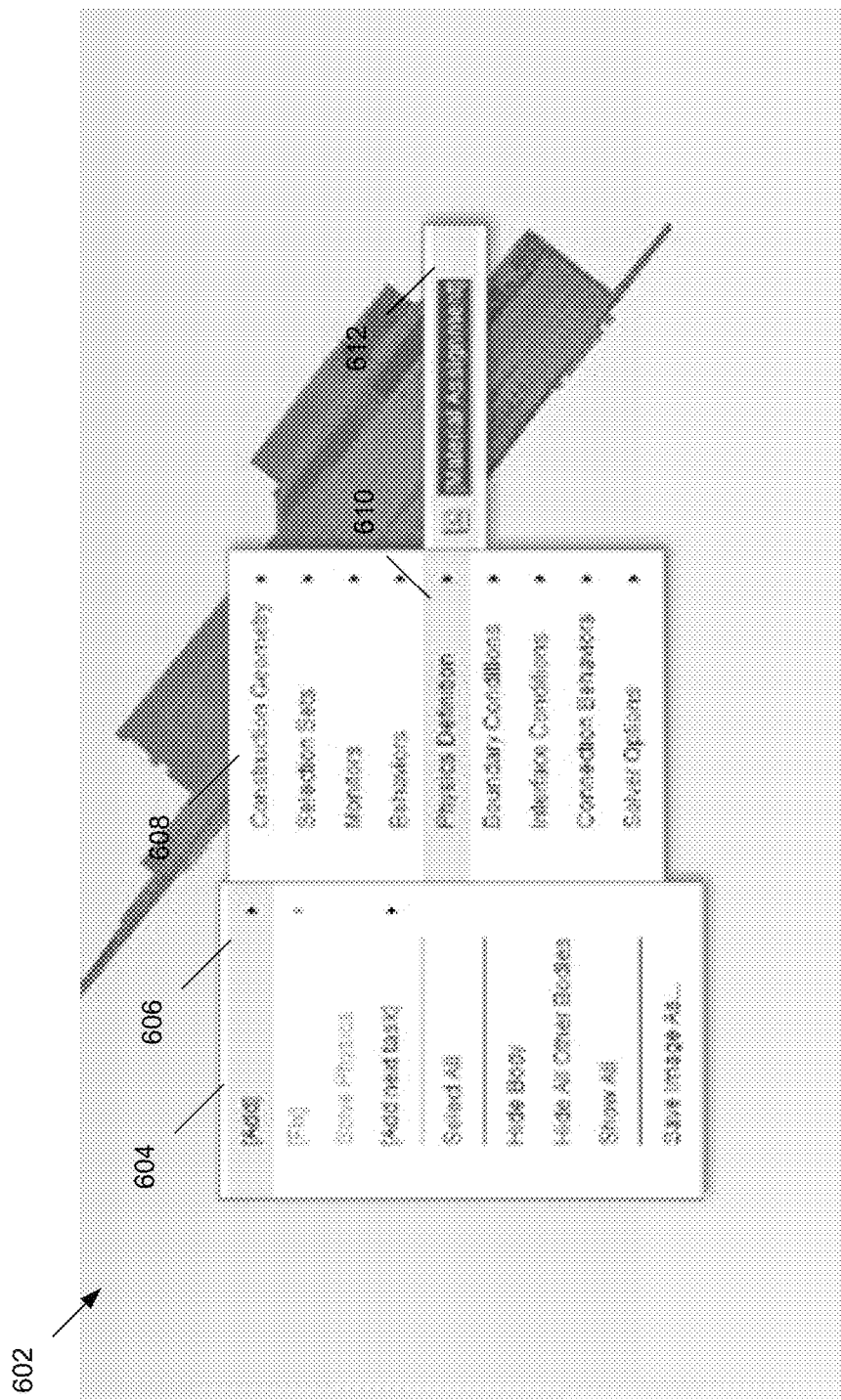
FIG. 6 is a diagram depicting a context menu presented when an object representing a physical entity requires an object representing a material assignment of a material be present in the simulation.

In addition to tasks requiring certain types of objects to be present in a simulation, certain objects present in a simulation may require other objects to be added to the simulation if they are not already present. FIG. 6 is a diagram depicting a context menu displayed when an object representing a physical entity requires an object representing a material of that physical entity be present in the simulation. The multi-level context menu 602 includes a first level 604 that would include a highlight at 606 (not shown) indicating that an object needs to be added to the simulation. A subsequent layer 608 would include an indicator at 610 (not shown) that indicates a type of object that needs to be added to the simulation, specifically a physics definition object type. A further layer depicts physics definition type objects that can be added, specifically a material assignment object at 612.

Figure 7:
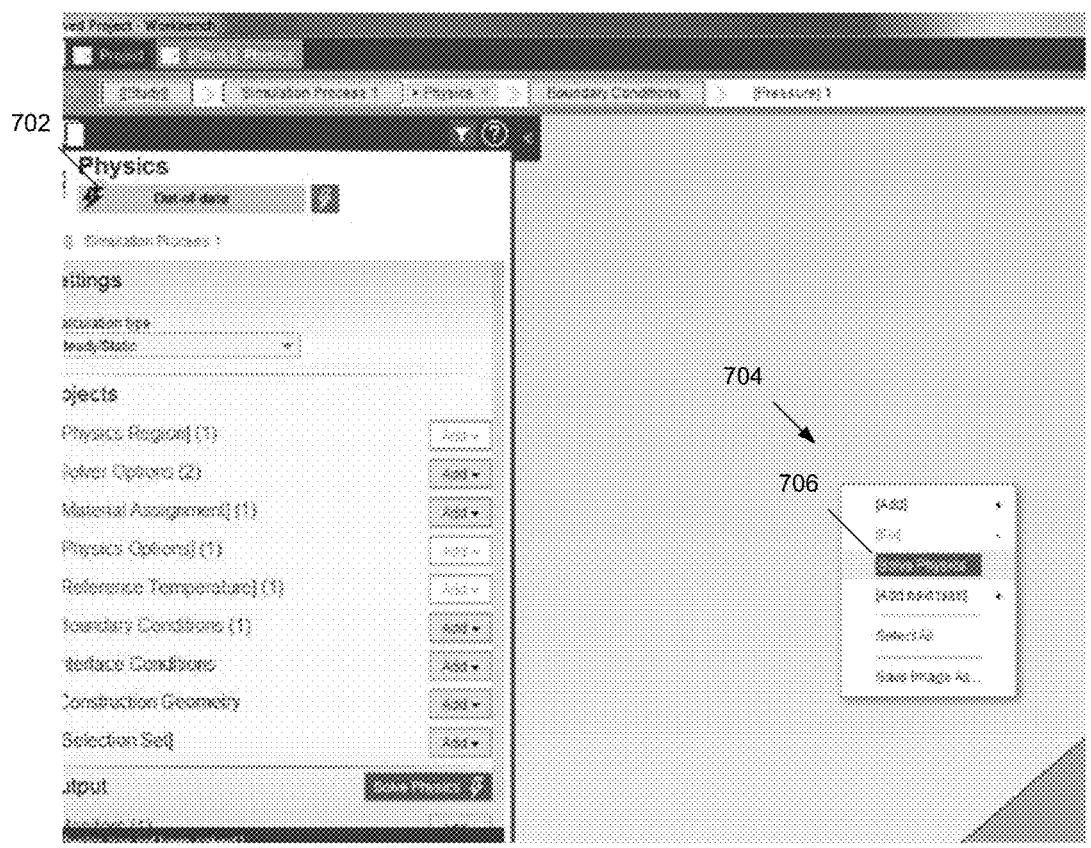
FIG. 7 is a diagram depicting a context menu providing a highlighted option for performing an out of date task when objects are in an error-free state and all required objects for the task are present in the simulation.

When objects that provide inputs to a task are modified, that task, in one example, is flagged as being out of date. FIG. 7 is a diagram depicting a context menu providing a highlighted option for performing an out of date task when objects are in an error-free state (e.g., those objects do not include any parameters in an invalid state) and all required objects for the task are present in the simulation. A parameter definition menu 702 indicates that the physics task is out of date. Because those objects are present and in an error-free state, the physics task can be executed. To alert a user to that fact, a context menu is presented at 704 that includes a highlight at 706 that indicates the out of date physics task to be performed. By clicking on that highlighted entry 706 in the context menu, the physics task is performed.

Figure 8:
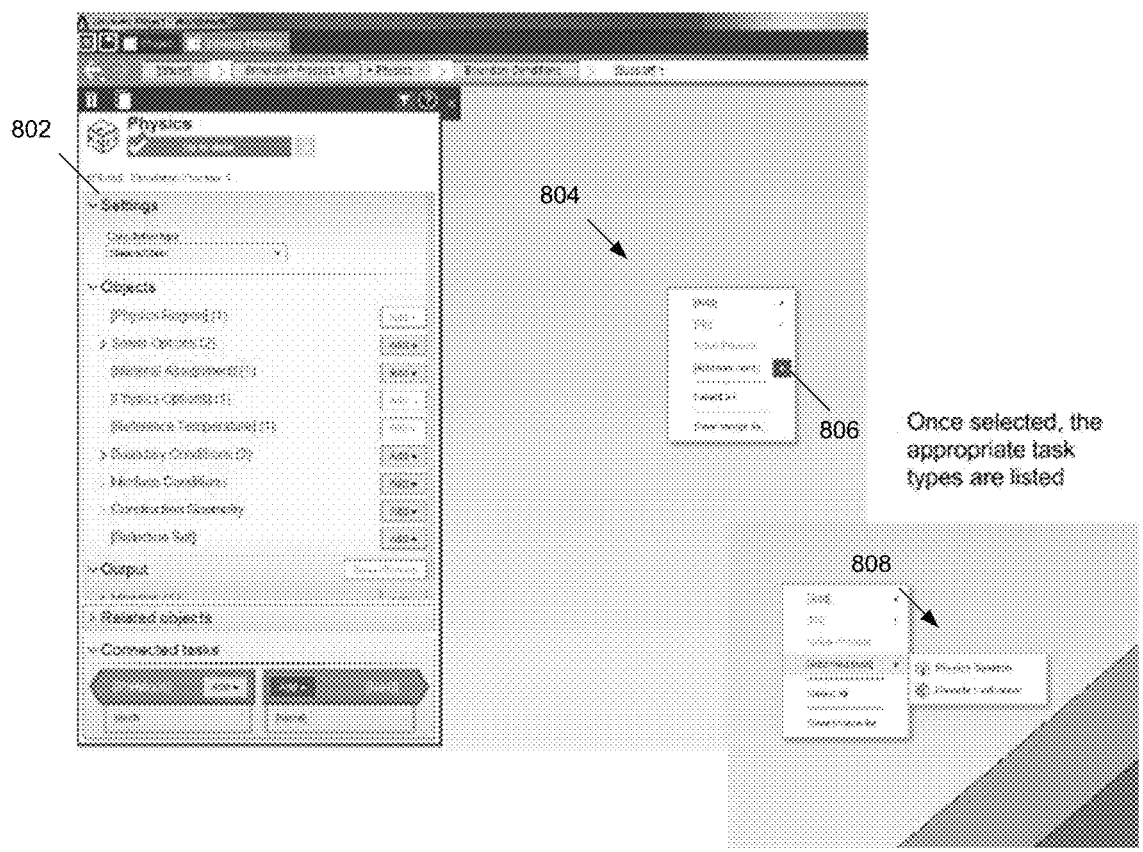
FIG. 8 is a diagram depicting a context menu for adding a missing downstream task.

In addition to tasks and objects sometimes requiring the presence of certain objects for possible performance, in one embodiment, certain tasks may utilize downstream tasks for proper operation. FIG. 8 is a diagram depicting a context menu for adding a missing downstream task. A system evaluates tasks present in the simulation based on a task to be performed. In the example of FIG. 8, the simulation includes a physics task, as indicated in the parameter definition window 802. An evaluation of the physics task discovers that a downstream "physics solution" or "results evaluation" task is not present in the simulation to accept the output of the physics task. Upon a right click operation by a user, a multi-layer context menu having multiple selectable options on each layer is provided. A first layer depicted at 804 includes a highlight at 806 indicating that a required task is missing from the simulation. A subsequent layer depicted at 808 includes an indication of a type of the task that needs to be added (e.g., a physics solution task or a results evaluation task).

Figure 9:
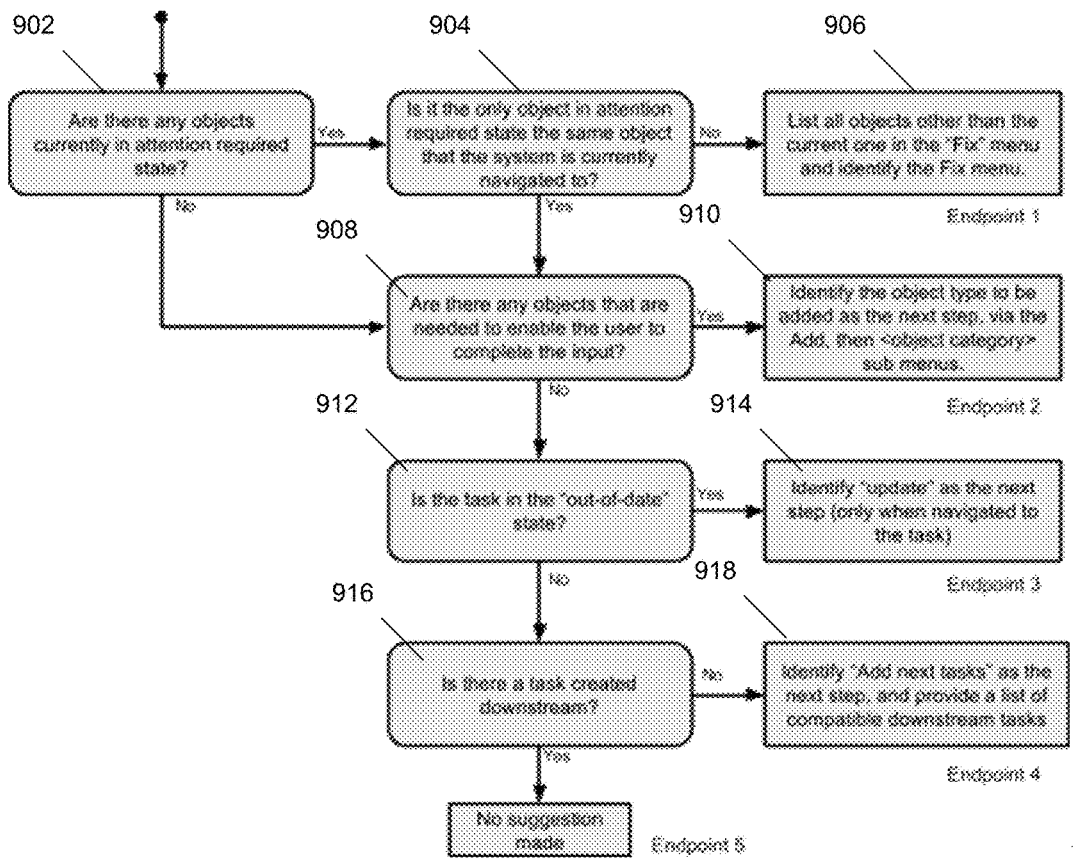
FIG. 9 is a flow diagram depicting a computer-implemented method of defining and executing a simulation of a physical system that includes a plurality of objects representing physical entities or phenomena.

FIG. 9 is a flow diagram depicting a computer-implemented method of defining and executing a simulation of a physical system that includes a plurality of objects representing physical entities or phenomena. At 902, an evaluation is made as to whether there are any objects currently in an "attention required" state. If there are objects in an attention required state, an inquiry is made at 904 as to whether the object needing attention is currently navigated to. If the currently navigated to object is not the only object needing attention, a menu (e.g., a context menu, a dialog box) is provided that highlights that one or more objects need fixing and lists all objects needing fixing other than the currently navigated to object at 906. At 908, a determination is made as to whether there are any objects missing from the simulation that are needed to enable the user to complete the input necessary for running the simulation task. If objects are missing, at 910, a menu is provided that highlights that one or more objects need added and lists all object types that need to be added to the simulation. At 912, an inquiry is made as to whether any tasks are in an out of date state (e.g., based on objects or tasks providing input to the task having been edited since the last run of the task). When a task is out of date, at 914, a menu is provided that identifies updating the task is the next step in performing the simulation. At 916, a determination is made as to whether any downstream tasks are missing from the simulation. When a downstream task is missing, at 918, a menu is provided that identifies adding a new task as the next step and provides a list of compatible downstream tasks.

Figure 10:
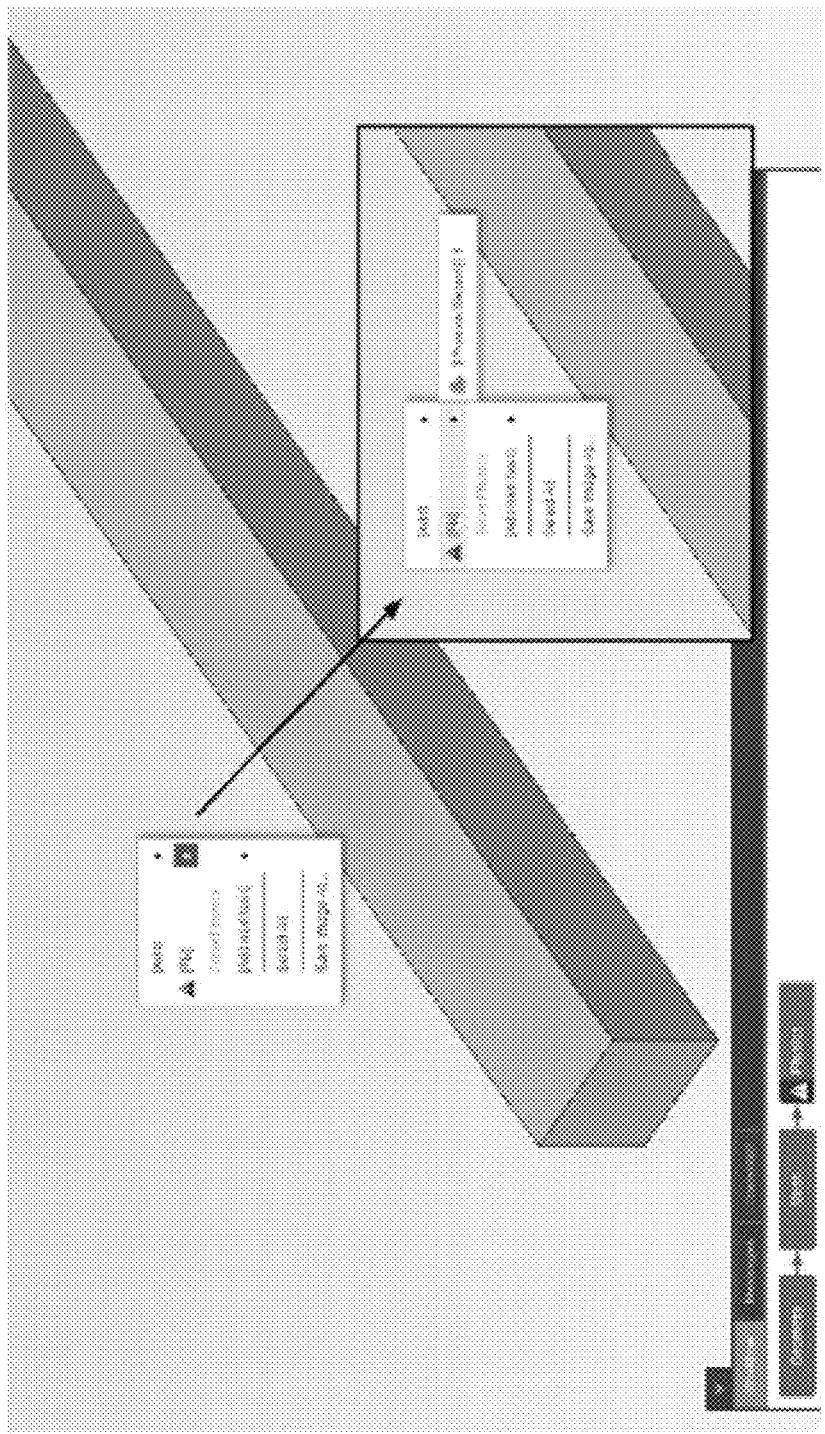
FIG. 10 depicts a first context menu, where a first level of the context menu includes a highlight indicating that an object needs fixed, and a second level of the context menu indicates that a physics region object includes a parameter in an invalid state.
Figure 11:
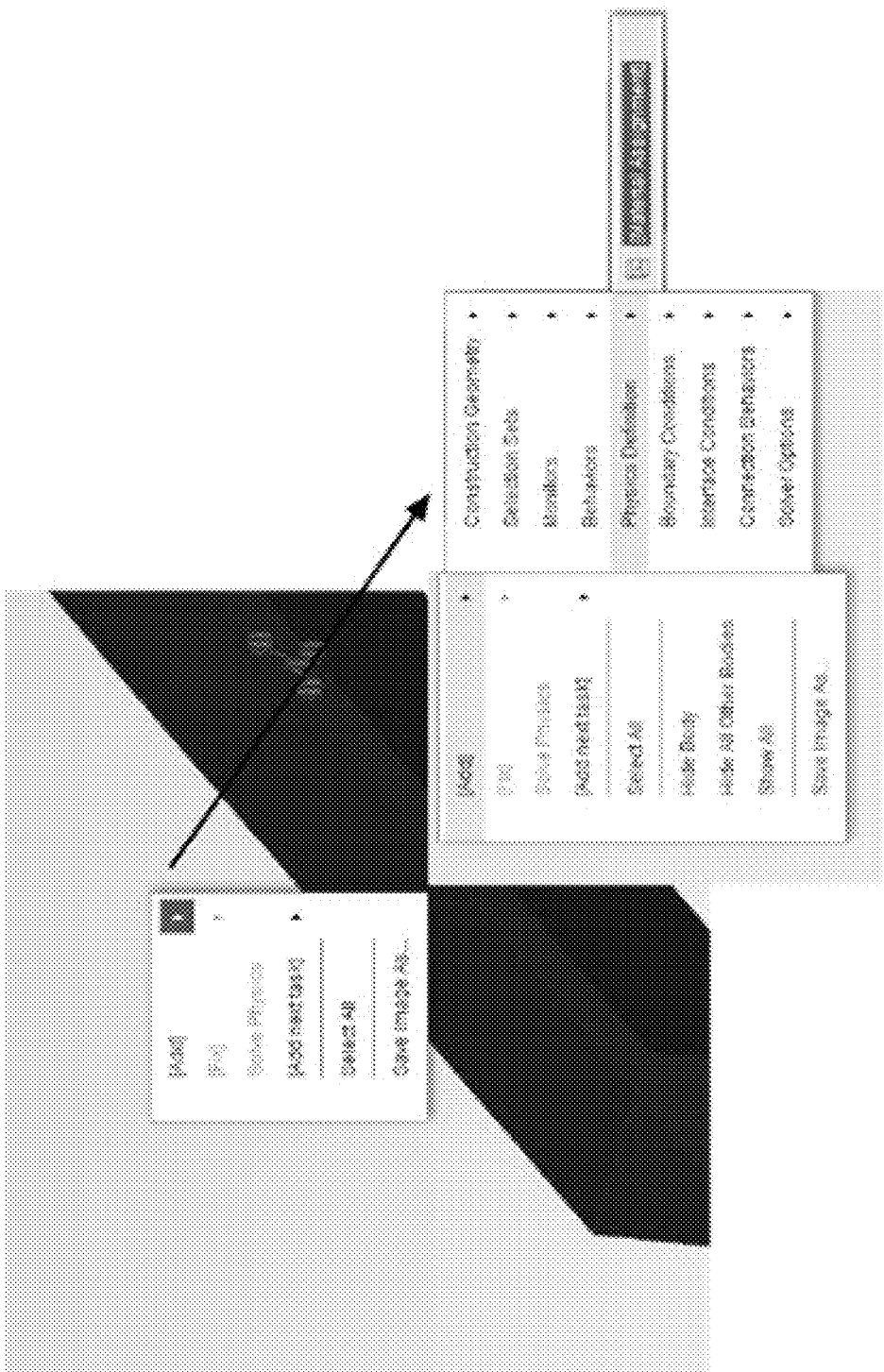
FIG. 11 depicts a second context menu, where a first level of the context menu includes a highlight indicating that a necessary object needs to be added, a second level includes an indication that a physics definition object needs to be added, and a third level includes an indication that a material assignment is the sub-type of object that needs to be added to the simulation.
Figure 12:
FIG. 12 is a diagram depicting a context menu provided for adding a necessary boundary condition object, where a first level includes an indicator that an object needs to be added, and a second level includes an indicator that a boundary condition object is the type of object that needs to be added to the simulation.
Figure 13:
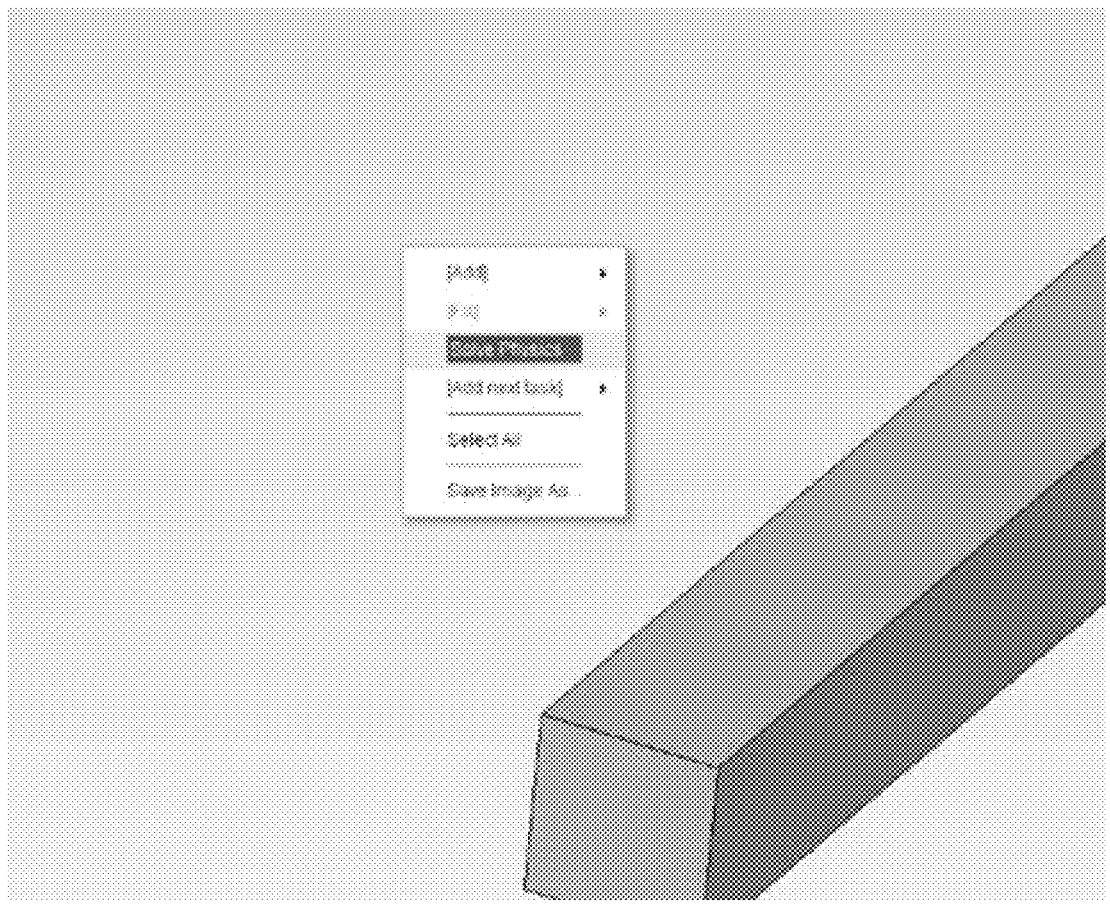
FIG. 13 is a diagram depicting a context menu provided when a task is eligible for being executed to bring it to an up-to-date state including an indication that the task is ready to be executed.
Figure 14:
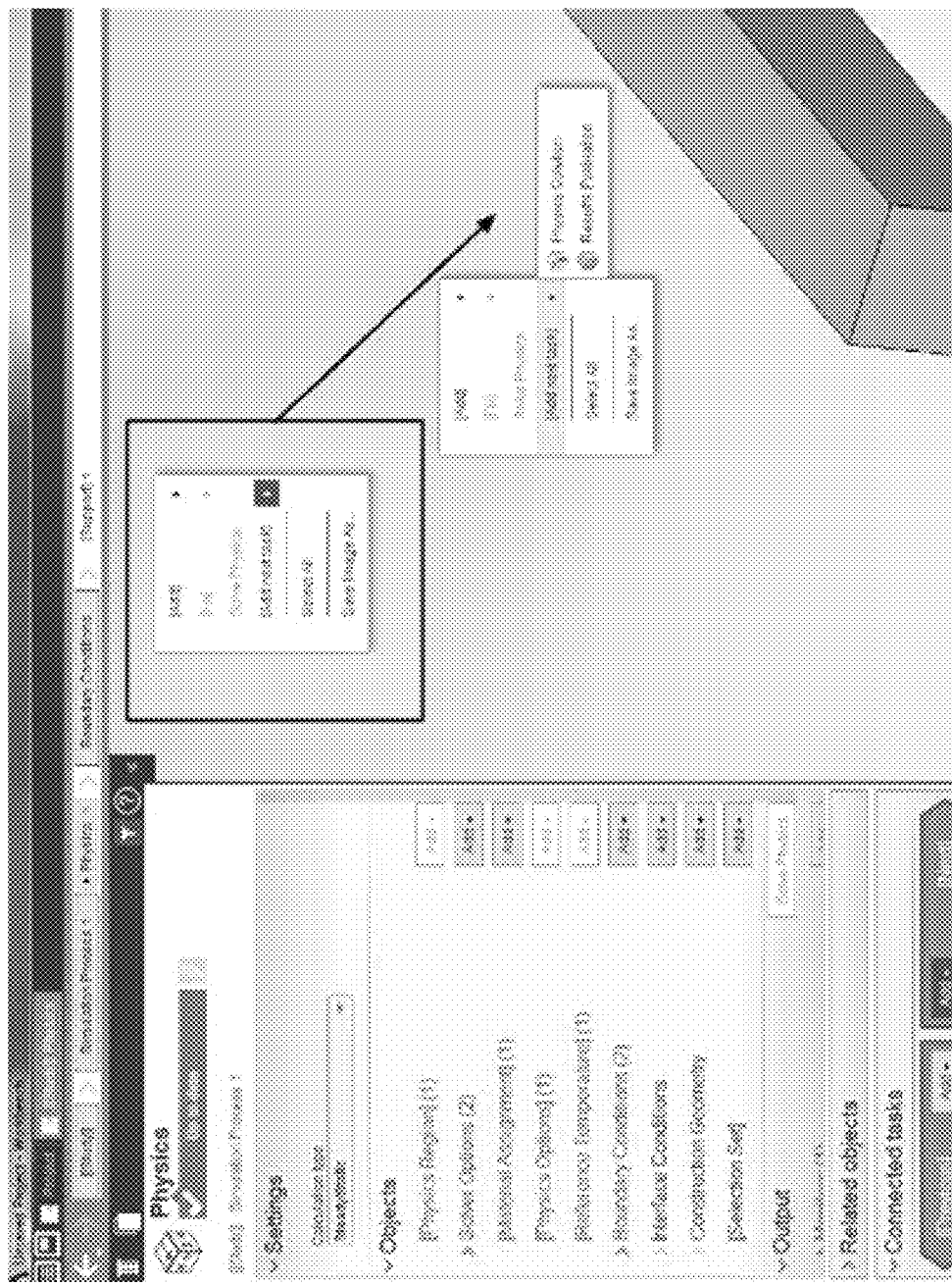
FIG. 14 is a diagram depicting a context menu provided for adding a necessary downstream task, where a first level includes an indicator that a downstream task needs to be added, and a second level includes an indicator of the types of downstream tasks that are appropriate to be added.

FIGS. 10-14 depict an example of a user guided workflow for defining a simulation for execution. FIG. 10 depicts a first context menu, where a first level of the context menu includes a highlight indicating that an object needs fixed, and a second level of the context menu indicates that a physics region object includes a parameter in an invalid state. FIG. 11 depicts a second context menu, where a first level of the context menu includes a highlight indicating that a necessary object needs to be added, a second level includes an indication (not shown) that a physics definition object needs to be added, and a third level includes an indication that a material assignment is the sub-type of object that needs to be added to the simulation. FIG. 12 is a diagram depicting a context menu provided for adding a necessary boundary condition object, where a first level includes an indicator (not shown) that an object needs to be added, and a second level includes an indicator that a boundary condition object is the type of object that needs to be added to the simulation. FIG. 13 is a diagram depicting a context menu provided when a task is eligible for being executed to bring it to an up-to-date state including an indication that the task is ready to be executed. FIG. 14 is a diagram depicting a context menu provided for adding a necessary downstream task, where a first level includes an indicator that a downstream task needs to be added, and a second level includes an indicator of the types of downstream tasks that are appropriate to be added.

Figure 15:
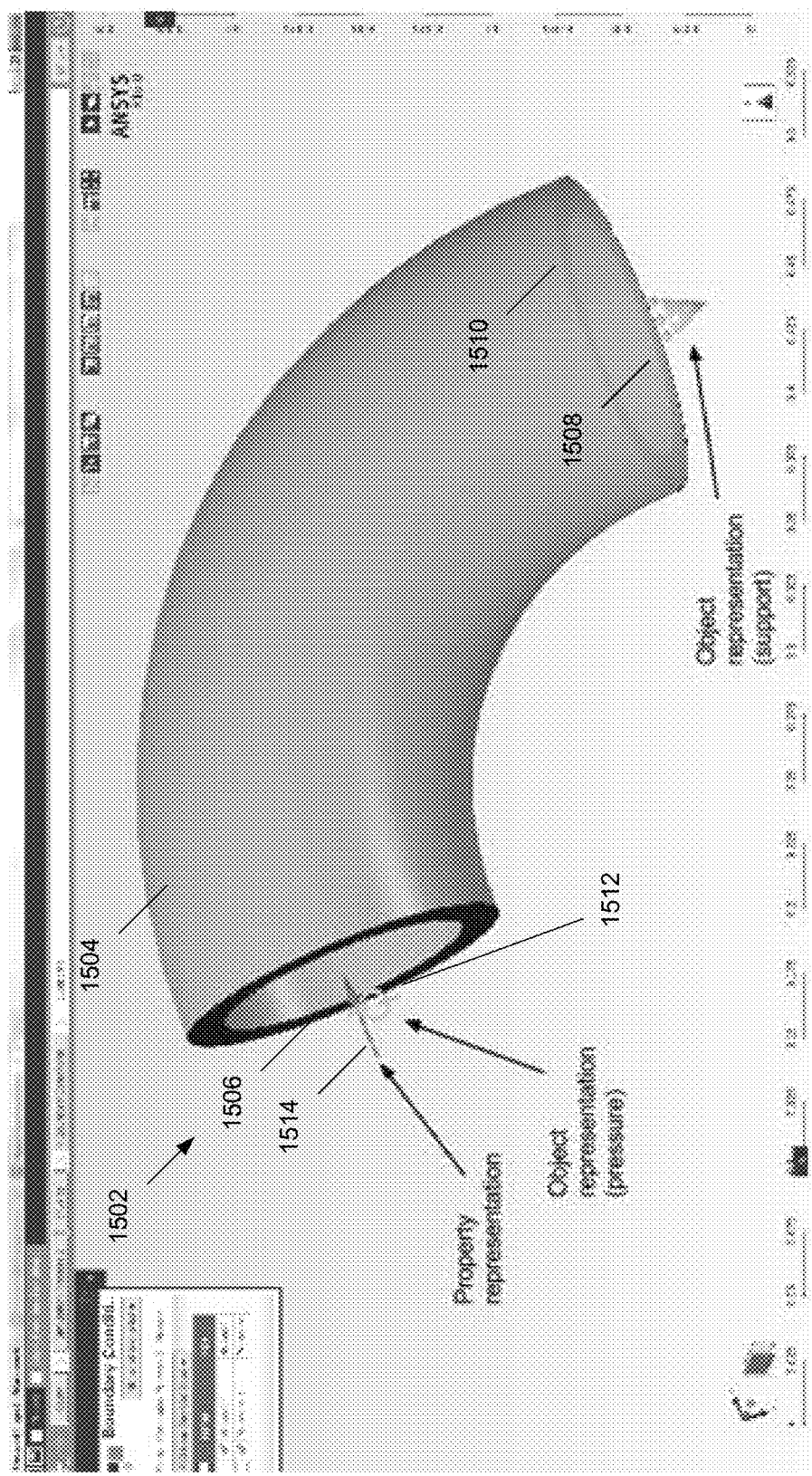
FIG. 15 is a diagram depicting visualization of certain objects present in a simulation definition.

As discussed above, a simulation visualization portion of a graphical user interface includes depictions of certain objects present in a simulation. FIG. 15 is a diagram depicting visualization of certain objects present in a simulation definition. The simulation of FIG. 15 seeks to model deformation of a pipe when a pressure is applied to an end surface of the pipe. The simulation visualization portion 1502 of the graphical user interface includes a visualization of a pipe physical object at 1504. An object associated with a first end face of the pipe is represented at 1506 as a highlighted surface. An object representing a "support" physical phenomenon is visualized by an icon at 1508. The support object informs the simulation that the pipe is supported at a second end 1510 of the pipe in a direction indicated by the icon 1508. By interacting with the icon 1508 (e.g., via a double click or single left or right click operation), parameters associated with the support object can be viewed and edited. A second physical phenomena associated with the pressure applied at the first end face 1506 of the pipe 1504 is represented by two indicators 1512, 1514. A first indicator 1512 is an icon in the form of a symbol representing the pressure object type. By interacting with that icon 1512, parameters associated with the pressure object can be viewed and edited via a menu. A second indicator 1514 of the physical phenomenon is displayed in the form of an arrow, where the second indicator indicates a value associated with a metadata physical parameter of the pressure object. In the example of FIG. 15, the second indicator 1514 indicates a site on the pipe object 1504 where the pressure is being applied (i.e., first end face 1506) and a direction of application of the pressure.

Figure 16:
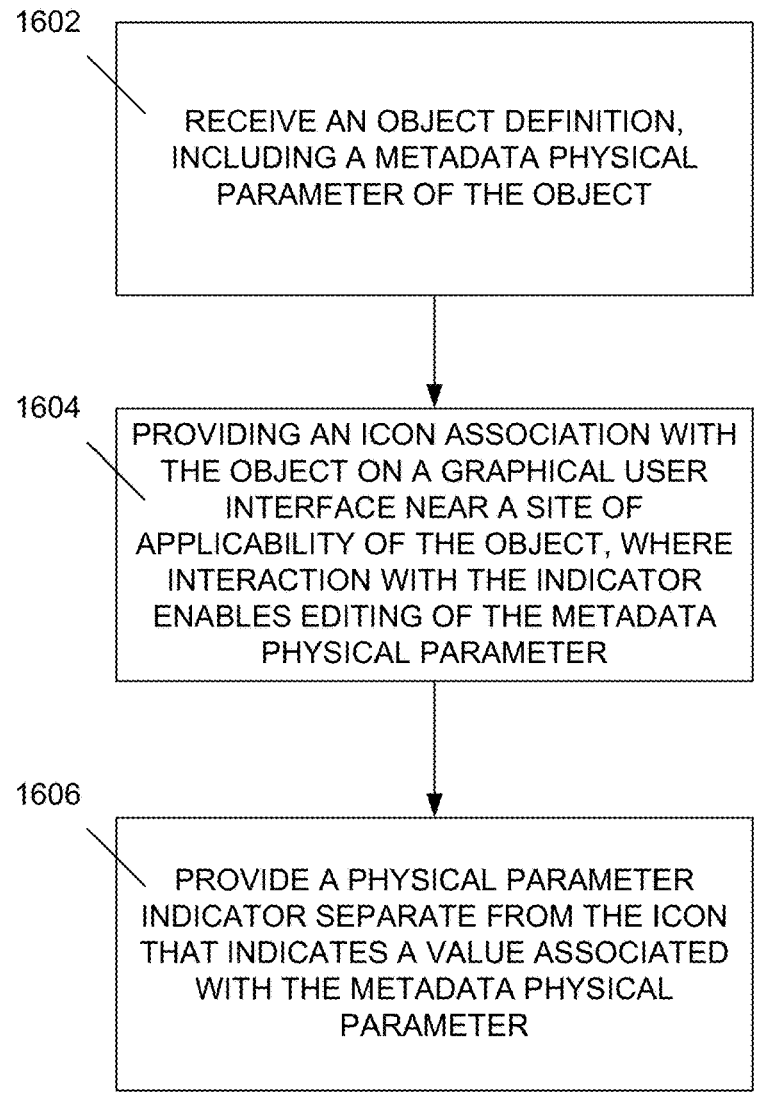
FIG. 16 is a flow diagram depicting a method of providing a simulation definition graphical user interface associated with a physical system that includes a plurality of objects representing physical entities or phenomena.

FIG. 16 is a flow diagram depicting a method of providing a simulation definition graphical user interface associated with a physical system that includes a plurality of objects representing physical entities or phenomena. The method includes displaying a representation of a physical entity in the graphical user interface. Data associated with a definition of an object associated with a physical phenomenon is received at 1602, where the data includes a metadata physical parameter associated with the physical phenomenon. A first indicator of the physical phenomenon is displayed in the graphical user interface at 1604, where user interaction with the first indicator provides a menu associated with the physical phenomenon, and a second indicator of the physical phenomenon is displayed at 1606, where the second indicator indicates a value associated with the metadata physical parameter.

Figure 17:
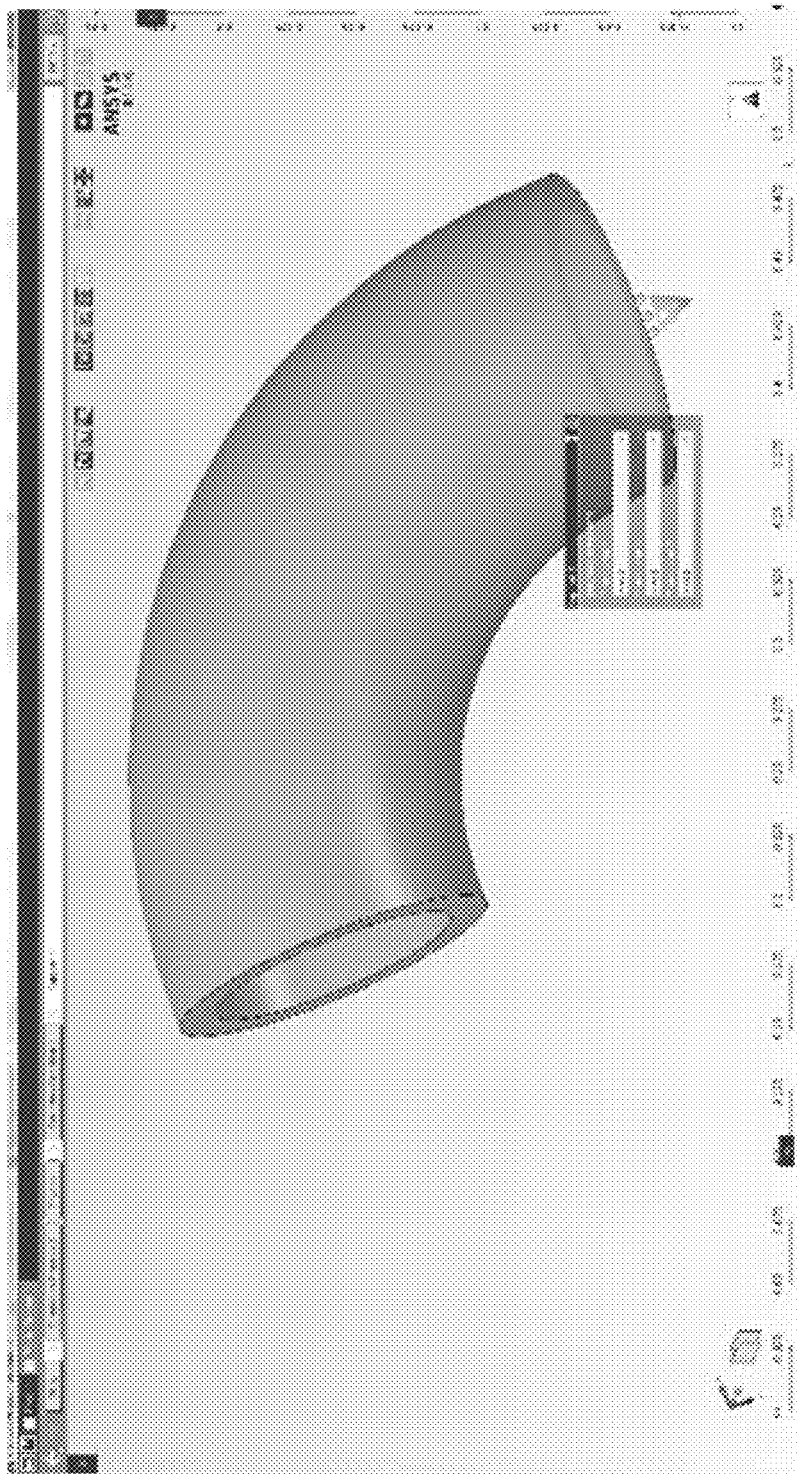
FIG. 17 is a diagram depicting a menu provided for viewing and editing parameters associated with a support object accessed via interaction with a support object indicator.
Figure 18:
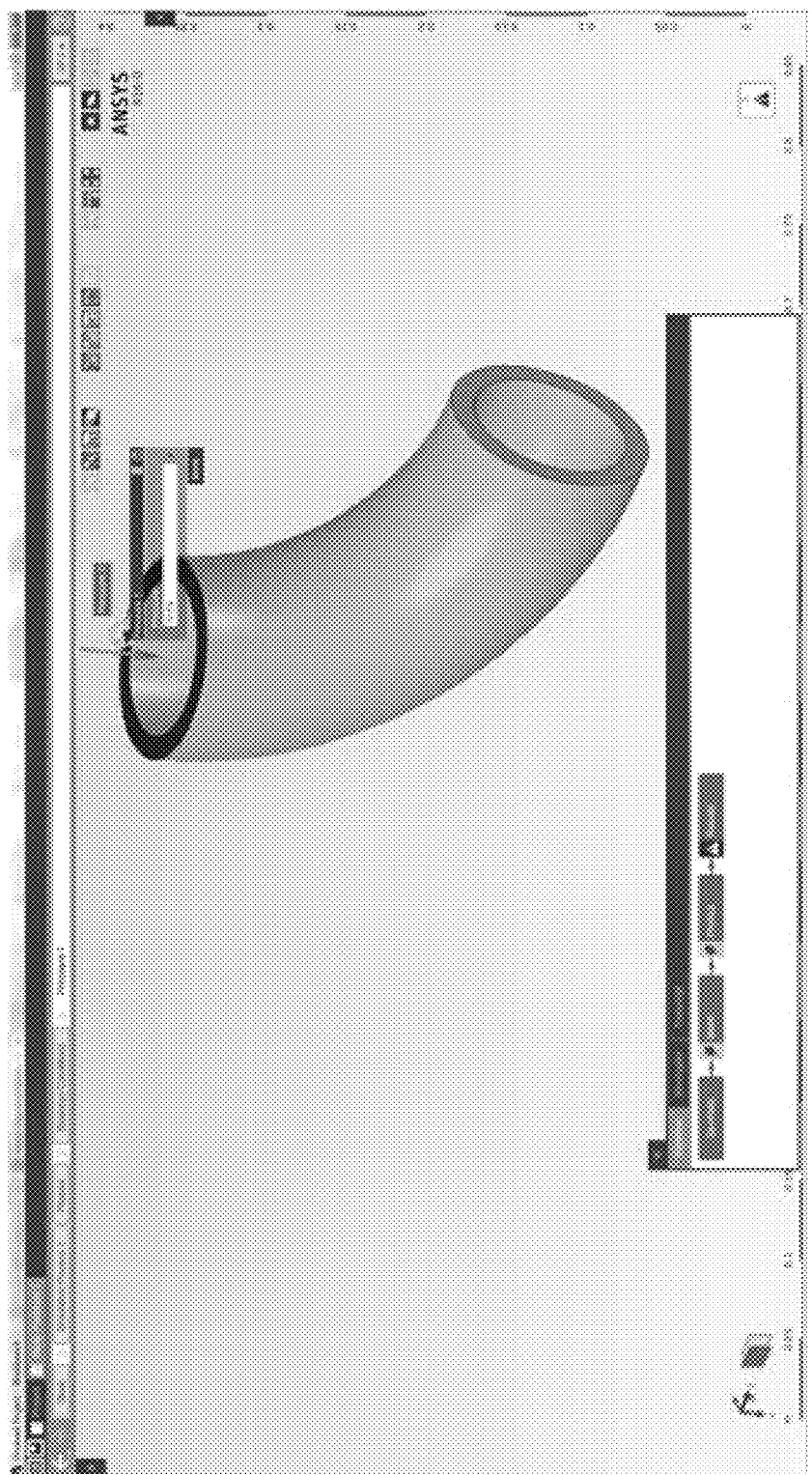
FIG. 18 is a diagram depicting a menu provided for viewing and editing a pressure amount parameter associated with a pressure object accessible via interaction with one or either of the indicators associated with the pressure object.
Figure 19:
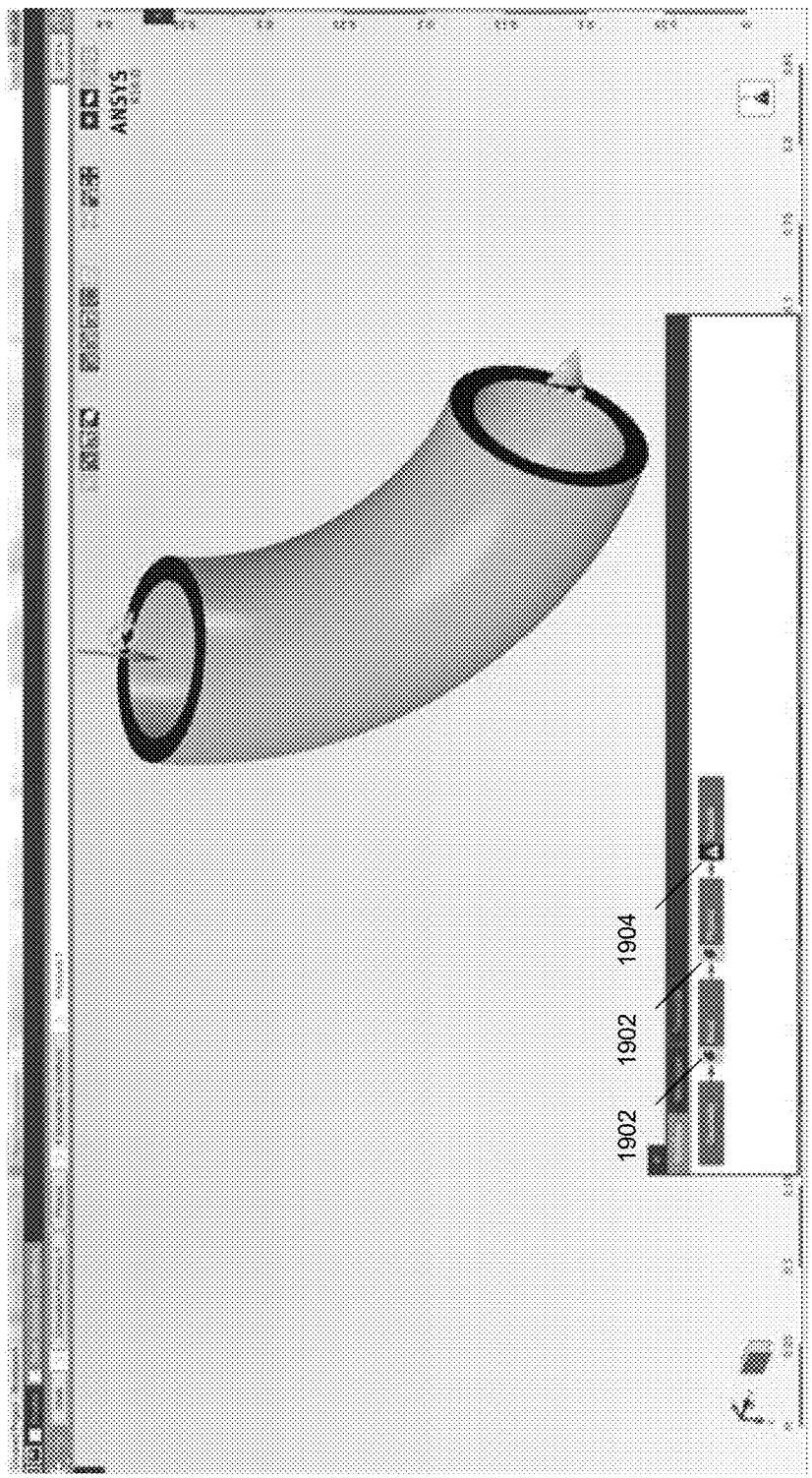
FIG. 19 is a diagram depicting a graphical user interface that includes a flow diagram having first indicators of out of date tasks and a second indicator of an object having parameters in an invalid state.

As noted above, interaction with object indicators in a simulation visualization can access menus for viewing and editing parameters of an associated object. FIG. 17 is a diagram depicting a menu provided for viewing and editing parameters associated with a support object accessed via interaction with a support object indicator. FIG. 18 is a diagram depicting a menu provided for viewing and editing a pressure amount parameter associated with a pressure object accessible via interaction with one or either of the indicators associated with the pressure object. FIG. 19 is a diagram depicting a graphical user interface that includes a flow diagram having first indicators at 1902 of out of date tasks and a second indicator at 1904 of an object having parameters in an invalid state.

As described above, certain objects can be included in a simulation that further describe other objects in the simulation. For example, initial condition objects, boundary condition objects, and interface condition objects can be added to a simulation to interact with objects representing physical entities. In one embodiment, boundary conditions that can be added to a simulation include a temperature condition, a pressure, a support, a force, an inertia load, a moment, or a displacement. Depending on a type of physics associated with a simulation (e.g., structural, fluid flow, thermal, electric, electromagnetic) or a type task to be performed in a simulation, the universe of conditions that are appropriate for including in a simulation may be limited. In one embodiment of the disclosure, conditions displayed in a menu are filtered based on a type of physics associated with a portion of a simulation.

Figure 20:
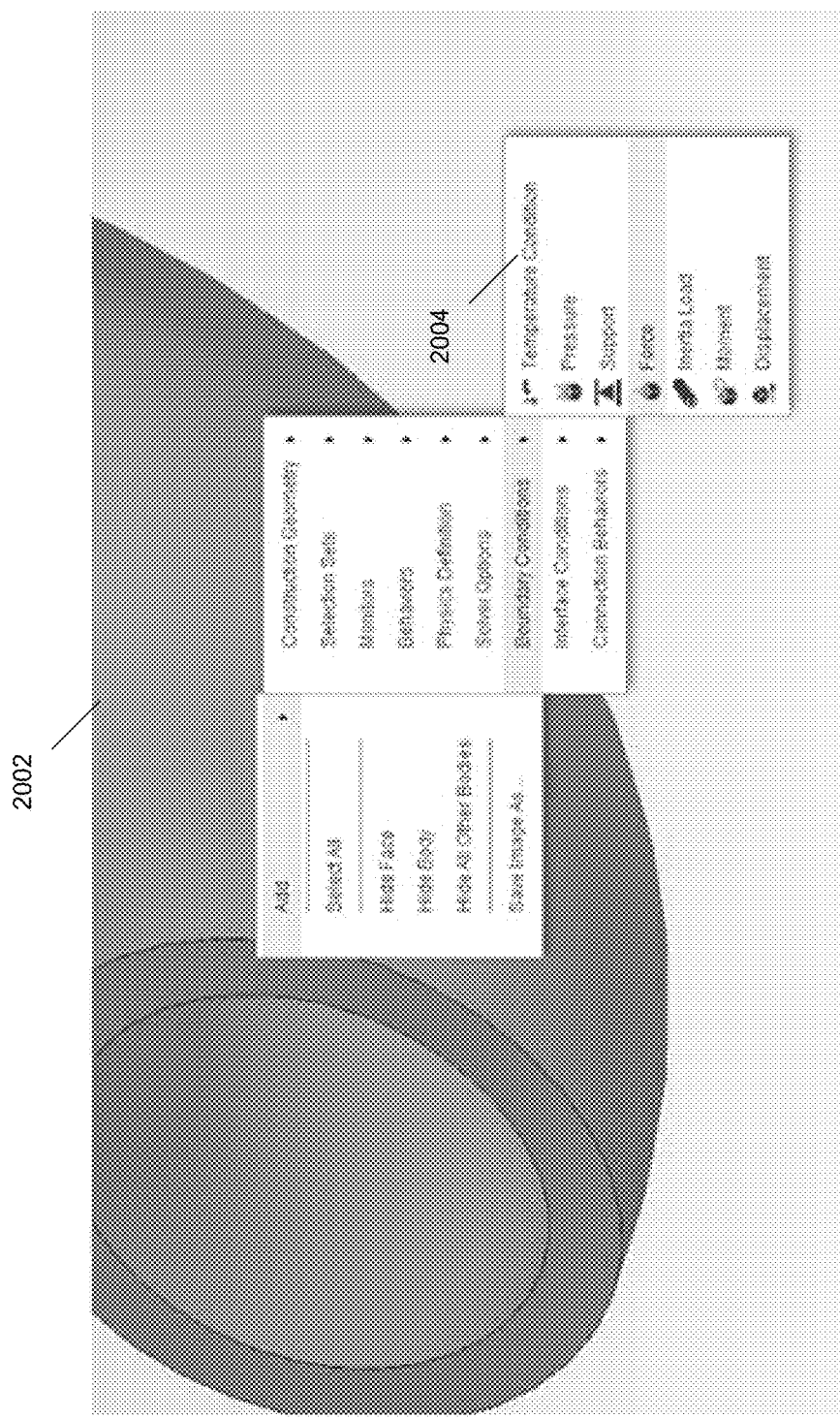
FIG. 20 is a diagram depicting a filtered context menu for adding a boundary condition to a simulation.

FIG. 20 is a diagram depicting a filtered context menu for adding a boundary condition to a simulation. A simulation visualization includes a visualization of a pipe physical entity at 2002. Via a right click operation, a user accesses a context menu and navigates that menu as displayed to add a boundary condition object associated with the pipe physical entity. The pipe physical entity is associated with a structural physics. Thus, the listing of boundary conditions provided at 2004 is filtered to only display boundary conditions associated with structural physics. For example, boundary conditions associated with voltages, currents, and magnetic fields, while present in a universe of boundary conditions that could be applied to the pipe object, are not displayed because they are not relevant to the structural physics associated with the pipe object 2002.

Figure 21:
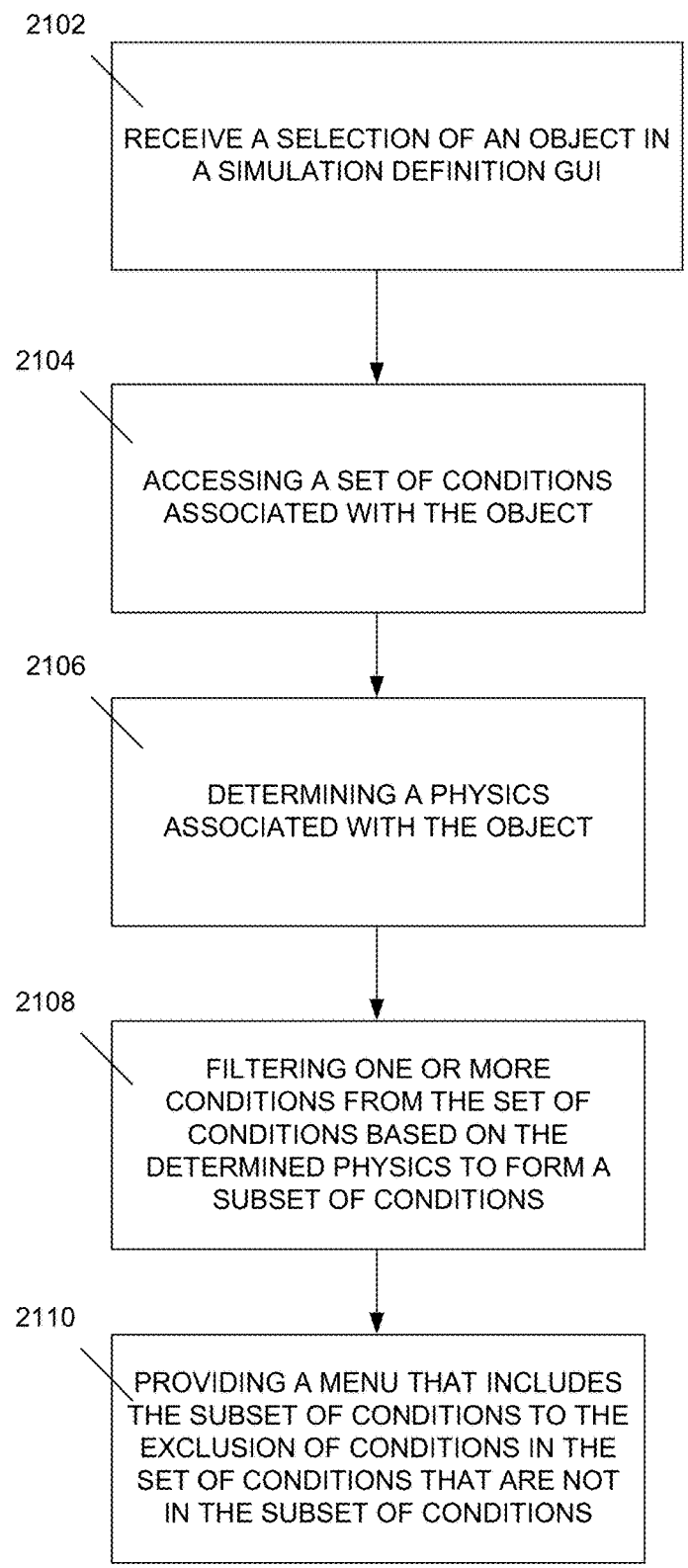
FIG. 21 is a flow diagram depicting a computer-implemented method of defining and executing a simulation of a physical system that includes a plurality of objects representing physical entities or phenomena.

FIG. 21 is a flow diagram depicting a computer-implemented method of defining and executing a simulation of a physical system that includes a plurality of objects representing physical entities or phenomena. A method includes receiving a selection of an object at 2102 and accessing a set of conditions associated with the selected object in a simulation at 2104, where the set of conditions include a physics condition, where the physics condition includes an identification of one or more physics-types associated with the object, which is determined at 2106. At 2108 pool of conditions associatable with the selected object is accessed. The pool of associatable conditions is filtered based on the one or more physics-types associated with the selected object to form a set of physics-type appropriate conditions. At 2110, a menu of conditions for adding or editing for the selected object is provided, where the menu includes the physics-type appropriate conditions without displaying conditions from the pool of conditions that are not in the set of physics-type appropriate conditions.

This application uses examples to illustrate the invention. The patentable scope of the invention includes other examples. For example, with reference to FIG. 3, in one embodiment the highlight of 304, which is detected in combination with an triangle/exclamation flag on the left side of the context menu, is omitted, showing only the triangle/exclamation flag to indicate that additional parameter specification is needed. In another example, a highlight can be included at 304 for a different purpose than to indicate a missing parameter or other entity that requires fixing, such as to indicate an ability to add an object via that menu. In a further example, no indication is provided in the circumstance where a problem can be fixed via adding an object as opposed to fixing (e.g., adding or adjusting a parameter to an existing object).

It is claimed:

1. A computer-implemented method of executing a simulation of a physical system that includes a plurality of objects representing physical entities or phenomena, comprising:
evaluating parameters of objects currently present in a simulation, said objects representing physical entities or phenomena within the physical system;
based on one of the parameters being in an invalid state, providing a first multi-layer context menu having a first set of one or more selectable options on a first set of multiple layers for display on a graphical user interface, wherein a first layer of the first set of multiple layers includes a highlight indicating an object to be updated based on identification of the invalid state, and wherein a subsequent layer of the first set of multiple layers includes indication of an identity of the object to be updated;
evaluating the objects currently present in the simulation based on the task to be performed;
providing, based on identifying a missing object is required for the simulation, a second multi-layer context menu having a second set of one or more selectable options on a second set of multiple layers for display of the graphical user interface, wherein a first layer of the second set of multiple layers includes a highlight indicating the missing object, and wherein a subsequent layer of the second set of multiple layers indicates a type of the missing object to be added;
based on all required objects being present in the simulation with valid parameters, providing a third context menu that includes a highlight that indicates the task to be performed.

2. The method of claim 1, further comprising:
evaluating the objects currently present in the simulation to determine if any second required objects are missing from the simulation, based on requirements of the objects currently present in the simulation;
when a second required object is missing from the simulation, providing a fourth multi-layer context menu having a fourth set of one or more selectable options on a fourth set of multiple layers, wherein a first layer of the fourth set of multiple layers includes a highlight indicating a missing object, and wherein a subsequent layer of the fourth set of multiple layers indicates a type of the object to be added.

3. The method of claim 1, further comprising:
evaluating tasks present in the simulation based on the task to be performed;
when a required task for the task to be performed is missing from the simulation, providing a fifth multi-layer context menu having a fifth set of one or more selectable options on a fifth set of multiple layers, wherein a first layer of the fifth set of multiple layers includes a highlight indicating task is missing, and wherein a subsequent layer of the fifth set of multiple layers includes an indication of a type of the task to be added.

4. The method of claim 1, wherein the second context menu is provided before the first context menu.

5. The method of claim 1, wherein the first, second, and third context menus are accessible via a right click operation or a touch screen operation.

6. The method of claim 1, wherein the task to be performed and objects in the simulation are indicated in a flow diagram, wherein selecting an object in the flow diagram highlights a visualization of that object in a simulation visualization portion of the graphical user interface.

7. The method of claim 6, wherein when a particular object includes a parameter in an invalid state, an icon of the flow diagram associated with the particular object includes an indicator identifying that the particular object includes a parameter in an invalid state.

8. The method of claim 6, wherein when a particular task is configured to receive an input from an object that has changes since a last time the particular task was executed, an icon of the flow diagram associated with the particular task includes an indicator identifying that the particular task is out of date.

9. The method of claim 1, wherein the parameter in the invalid state is a parameter having a null or zero value.

10. The method of claim 1, wherein the required object is a simulation input object.

11. The method of claim 1, wherein the highlight indicating that an object needs fixed is a background highlight.

12. The method of claim 1, wherein the required object is a material type object, an initial condition object, a boundary condition object, or an interface condition object.

13. The method of claim 12, wherein the required object is a boundary condition object, and wherein the boundary condition object represents an applied condition, a load, a physics constraint, an energy source, or a fluid flow.

14. A computer-implemented method of executing a simulation of a physical system that includes a plurality of objects representing physical entities or phenomena, comprising:
receiving, based on user input to a graphical user interface, a selection of an object in the simulation, said object representing a physical entity or phenomenon within the physical system;
accessing a set of conditions associated with the selected object in the simulation, wherein the set of conditions include a physics condition, wherein the physics condition includes an identification of one or more physics-types associated with the selected object;
accessing a pool of conditions associatable with the selected object;
determining a physics-type associated with the selected object;
filtering the pool of associatable conditions based on the one or more physics-types associated with the selected object to form a set of physics-type appropriate conditions;
identifying a missing parameter associated with the selected object, required for the simulation; and
providing, for display on the graphical user interface, a menu of conditions for adding or editing for the selected object and adding the missing parameter associated with the selected object, wherein the menu includes the physics-type appropriate conditions without displaying conditions from the pool of conditions that are not in the set of physics-type appropriate conditions.

15. The method of claim 14, wherein the one or more physics-types include one or more of structural physics, fluid flow physics, thermal physics, electric physics, and electromagnetic physics.

16. The method of claim 14, wherein the set of conditions are boundary conditions, interface conditions, or initial conditions.

17. The method of claim 14, wherein the menu of conditions is accessed via a context menu accessible via a mouse operation or a touch screen operation.

18. A computer-implemented method of executing a simulation of a physical system that includes a plurality of objects representing physical entities or phenomena, comprising:
   evaluating parameters of objects currently present in a simulation, said objects representing physical entities or phenomena within the physical system;
   based on one of the parameters being in an invalid state, providing a first multi-layer context menu having a first set of one or more selectable options on a first set of multiple layers for display on a graphical user interface, wherein a first layer of the first set of multiple layers includes a highlight indicating an object to be updated based on identification of the invalid state, and wherein a subsequent layer of the first set of multiple layers includes indication of an identity of the object to be updated;
a subsequent layer of the second set of multiple layers indicates a type of the object to be added;
   based on all objects in the simulation having valid parameters, providing a second context menu that includes a highlight that indicates the task to be performed.

19. A computer-implemented system for executing a simulation of a physical system that includes a plurality of objects representing physical entities or phenomena, comprising:
   one or more data processors;
   a computer-readable medium encoded with instructions for commanding the one or more data processors to execute steps of a process that includes:
   evaluating parameters of objects currently present in a simulation, said objects representing physical entities or phenomena within the physical system;
   based on one of the parameters being in an invalid state, providing a first multi-layer context menu having a first set of one or more selectable options on a first set of multiple layers for display on a graphical user interface, wherein a first layer of the first set of multiple layers includes a highlight indicating an object to be updated based on identification of the invalid state, and wherein a subsequent layer of the first set of multiple layers includes indication of an identity of the object to be updated;
a subsequent layer of the second set of multiple layers indicates a type of the object to be added;
   based on all objects in the simulation having valid parameters, providing a second context menu that includes a highlight that indicates the task to be performed.

20. A computer-readable medium encoded with instructions for commanding one or more data processors to execute a method of executing a simulation of a physical system that includes a plurality of objects representing physical entities or phenomena, comprising:
   evaluating parameters of objects currently present in a simulation, said objects representing physical entities or phenomena within the physical system;
   based on one of the parameters being in an invalid state, providing a first multi-layer context menu having a first set of one or more selectable options on a first set of multiple layers for display on a graphical user interface, wherein a first layer of the first set of multiple layers includes a highlight indicating an object to be updated based on identification of the invalid state, and wherein a subsequent layer of the first set of multiple layers includes indication of an identity of the object to be updated,
   a subsequent layer of the second set of multiple layers indicates a type of the object to be added;
   based on all objects in the simulation having valid parameters, providing a second context menu that includes a highlight that indicates the task to be performed.

21. A computer-implemented method of executing a simulation of a physical system that includes a plurality of objects representing physical entities or phenomena, comprising:
   evaluating objects currently present in the simulation based on a task to be performed;
   identifying a required object missing for the task to be performed in the simulation;
   providing, based on the identified missing required object, a first multi-layer context menu having a first set of one or more selectable options on a first set of multiple layers for display of the graphical user interface, wherein a first layer of the first set of multiple layers includes a highlight indicating the required object, and wherein a subsequent layer of the first set of multiple layers indicates a type of the required object to be added;
   based on all required objects being present in the simulation, providing a second context menu that includes a highlight that indicates the task to be performed.

22. A computer-implemented system for executing a simulation of a physical system that includes a plurality of objects representing physical entities or phenomena, comprising:
   one or more data processors,
   a computer-readable medium encoded with instructions for commanding the one or more data processors to execute steps of a process that includes:
   evaluating objects currently present in the simulation based on a task to be performed,
   identifying a required object missing for the task to be performed in the simulation,
   providing, based on the identified missing required object, a first multi-layer context menu having a first set of one or more selectable options on a first set of multiple layers for display of the graphical user interface, wherein a first layer of the first set of multiple layers includes a highlight indicating the required object, and wherein a subsequent layer of the first set of multiple layers indicates a type of the required object to be added,
   based on all required objects being present in the simulation, providing a second context menu that includes a highlight that indicates the task to be performed.

23. A computer-readable medium encoded with instructions for commanding one or more data processors to execute a method of executing a simulation of a physical system that includes a plurality of objects representing physical entities or phenomena, comprising:
   evaluating objects currently present in the simulation based on a task to be performed;
   identifying a required object missing for the task to be performed in the simulation;
   providing; based on the identified missing required object, a first multi-layer context menu having a first set of one or more selectable options on a first set of multiple layers for display of the graphical user interface, wherein a first layer of the first set of multiple layers includes a highlight indicating the required object, and wherein a subsequent layer of the first set of multiple layers indicates a type of the required object to be added;

based on all required objects being present in the simulation, providing a second context menu that includes a highlight that indicates the task to be performed.

* * * * *